(12) United States Patent
Katrak et al.

(10) Patent No.: US 10,634,709 B2
(45) Date of Patent: Apr. 28, 2020

(54) DIAGNOSTIC SYSTEM FOR A VEHICLE ELECTRICAL SYSTEM

(71) Applicant: LG Chem, Ltd., Seoul (KR)

(72) Inventors: Kerfegar K. Katrak, Fenton, MI (US); Sagar V. Nagaluru, Madison Heights, MI (US); Thaddeus Steyskal, Royal Oak, MI (US); Su Hyuk Jang, Sterling Heights, MI (US); Kunal Tipnis, Troy, MI (US)

(73) Assignee: LG Chem, Ltd., Seoul (KR)

( * ) Notice: Subject to any disclaimer, the term of this patent is extended or adjusted under 35 U.S.C. 154(b) by 273 days.

(21) Appl. No.: 15/950,294

(22) Filed: Apr. 11, 2018

(65) Prior Publication Data

US 2018/0323025 A1 Nov. 8, 2018

Related U.S. Application Data

(60) Provisional application No. 62/500,816, filed on May 3, 2017.

(51) Int. Cl.
*G01R 31/00* (2006.01)
*G01R 19/10* (2006.01)
(Continued)

(52) U.S. Cl.
CPC .......... *G01R 31/005* (2013.01); *B60R 16/033* (2013.01); *B60R 16/0315* (2013.01);
(Continued)

(58) Field of Classification Search
CPC .. G01R 31/3278; G01R 19/10; G01R 31/005; G01R 31/007; G01R 31/01; H01H 47/22;
(Continued)

(56) References Cited

U.S. PATENT DOCUMENTS 4,922,492 A * 5/1990 Fasang ............... G01R 31/3167
714/724
6,803,768 B2 * 10/2004 Serratoni ............... H02J 7/1461
324/416
(Continued)

OTHER PUBLICATIONS

U.S. Appl. No. 15/950,478, filed Apr. 11, 2018 entitled Diagnostic System for a Vehicle System.
(Continued)

*Primary Examiner* — Alfonso Perez Borroto
*Assistant Examiner* — Esayas G Yeshaw
(74) *Attorney, Agent, or Firm* — Buckert Patent & Trademark Law Firm PC; John F. Buckert

(57) ABSTRACT

A diagnostic having an analog-to-digital converter that is electrically coupled to an output port of a first analog multiplexer and an output port of a second analog multiplexer is provided. The analog-to-digital converter receives the high side voltage level signal and the low side current level signal at first and second times, respectively, and outputs a high side voltage value and a low side current value, respectively, based on the high side voltage level signal and the low side current level signal, respectively, that are received by a microcontroller. The microcontroller commands a high side driver circuit and a low side driver circuit to transition a contact of the contactor to an open operational position when the first analog multiplexer is malfunctioning based on the high side voltage value.

13 Claims, 6 Drawing Sheets

(51) Int. Cl.
*G07C 5/08* (2006.01)
*G01R 31/327* (2006.01)
*G01R 31/01* (2020.01)
*B60R 16/03* (2006.01)
*B60R 16/033* (2006.01)
*H01H 47/00* (2006.01)
*H01H 47/22* (2006.01)

(52) U.S. Cl.
CPC ............ *G01R 19/10* (2013.01); *G01R 31/007* (2013.01); *G01R 31/01* (2013.01); *G01R 31/3278* (2013.01); *G07C 5/08* (2013.01); *H01H 47/002* (2013.01); *H01H 47/22* (2013.01)

(58) Field of Classification Search
CPC .............. H01H 47/002; B60R 16/0315; B60R 16/033; G07C 5/08
See application file for complete search history.

(56) References Cited

U.S. PATENT DOCUMENTS

| | | |
|---|---|---|
| 7,397,224 B2 | 7/2008 | Jabaji |
| 7,923,976 B2 | 4/2011 | Al-Shyoukh et al. |
| 9,728,359 B1 | 8/2017 | Katrak et al. |
| 2013/0088246 A1* | 4/2013 | Lundstrum ........ H03K 17/9622 324/686 |
| 2016/0254766 A1* | 9/2016 | Brown ................ H02P 6/20 318/400.35 |

OTHER PUBLICATIONS

U.S. Appl. No. 15/950,377, filed Apr. 11, 2018 entitled Diagnostic System for a Vehicle Electrical System.

* cited by examiner

DIAGNOSTIC SYSTEM FOR A VEHICLE ELECTRICAL SYSTEM

CROSS-REFERENCE TO RELATED APPLICATION

This application claims priority to U.S. Provisional Patent Application No. 62/500,816 filed on May 3, 2017, the entire contents of which are hereby incorporated by reference herein.

BACKGROUND

The inventors herein have recognized a need for an improved diagnostic system for a vehicle electrical system that utilizes first and second analog multiplexers. The diagnostic system transitions a contactor to an open operational position if at least one of the first and second analog multiplexers are malfunctioning.

SUMMARY

A diagnostic system for a vehicle electrical system in accordance with an exemplary embodiment is provided. The vehicle electrical system has a battery module, a contactor, a high side driver circuit, and a low side driver circuit. The diagnostic system includes a high side voltage measuring circuit that is electrically coupled to the high side driver circuit and to a first input port of a first analog multiplexer. The high side voltage measuring circuit generates a high side voltage level signal corresponding to a high side voltage being applied to a contactor coil of the contactor. The high side voltage level signal is received by the first input port. The diagnostic system further includes a low side current measuring circuit that is electrically coupled to the low side driver circuit, and is further electrically coupled to a second input port of a second analog multiplexer. The low side current measuring circuit generates a low side current level signal corresponding to an amount of electrical current flowing through the contactor coil that is received by the second input port. The diagnostic system further includes an analog-to-digital converter that is electrically coupled to an output port of the first analog multiplexer and an output port of the second analog multiplexer. The analog-to-digital converter receives the high side voltage level signal and the low side current level signal at first and second times, respectively, and outputs a high side voltage value and a low side current value, respectively, based on the high side voltage level signal and the low side current level signal, respectively, that are received by a microcontroller. The microcontroller commands the high side driver circuit and the low side driver circuit to transition a contact of the contactor to an open operational position when the first analog multiplexer is malfunctioning based on the high side voltage value.

DETAILED DESCRIPTION

Figure 1A:
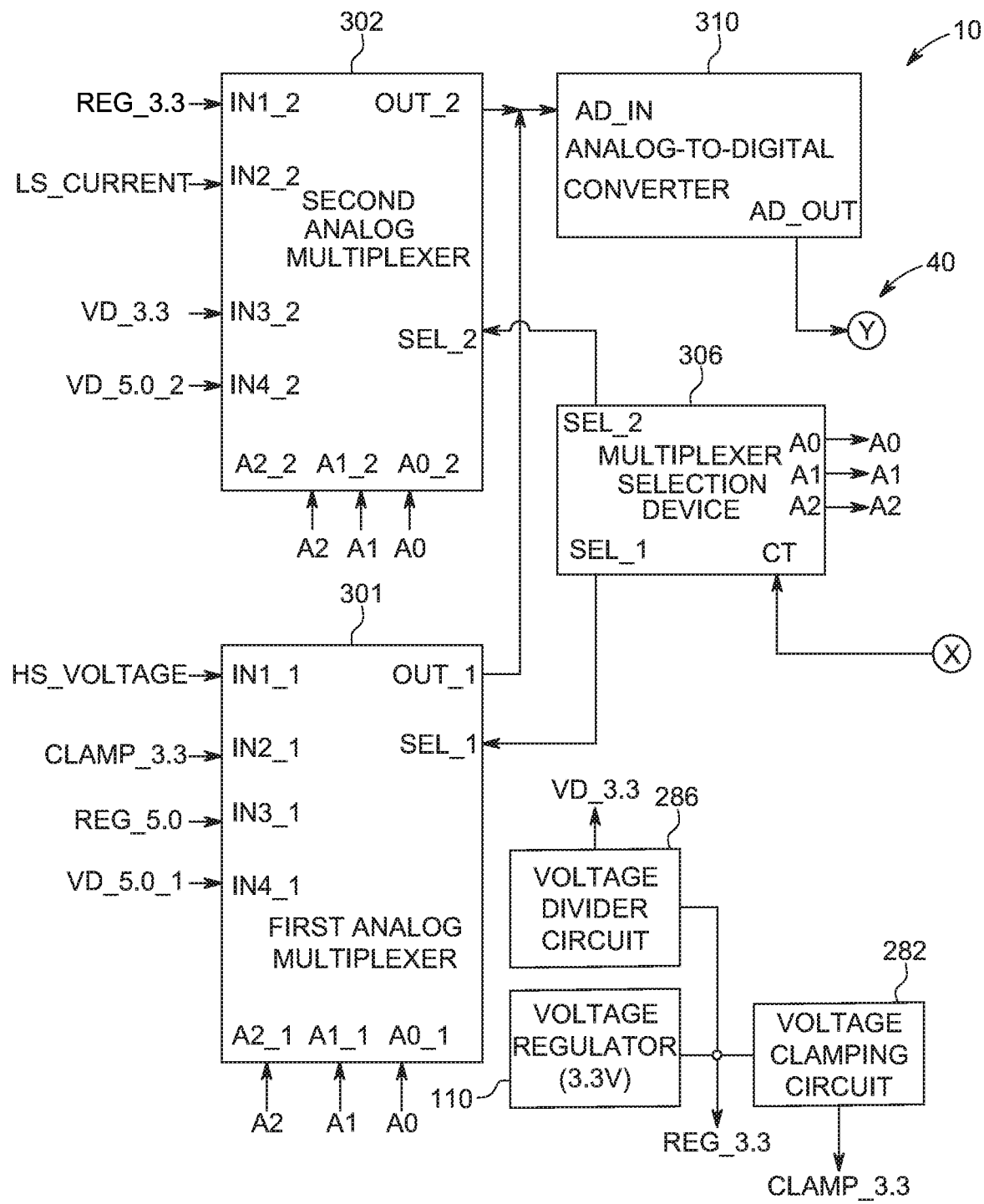
FIGS. 1A and 1B are schematics of a vehicle having a vehicle electrical system and a diagnostic system in accordance with an exemplary embodiment.
Figure 1B:
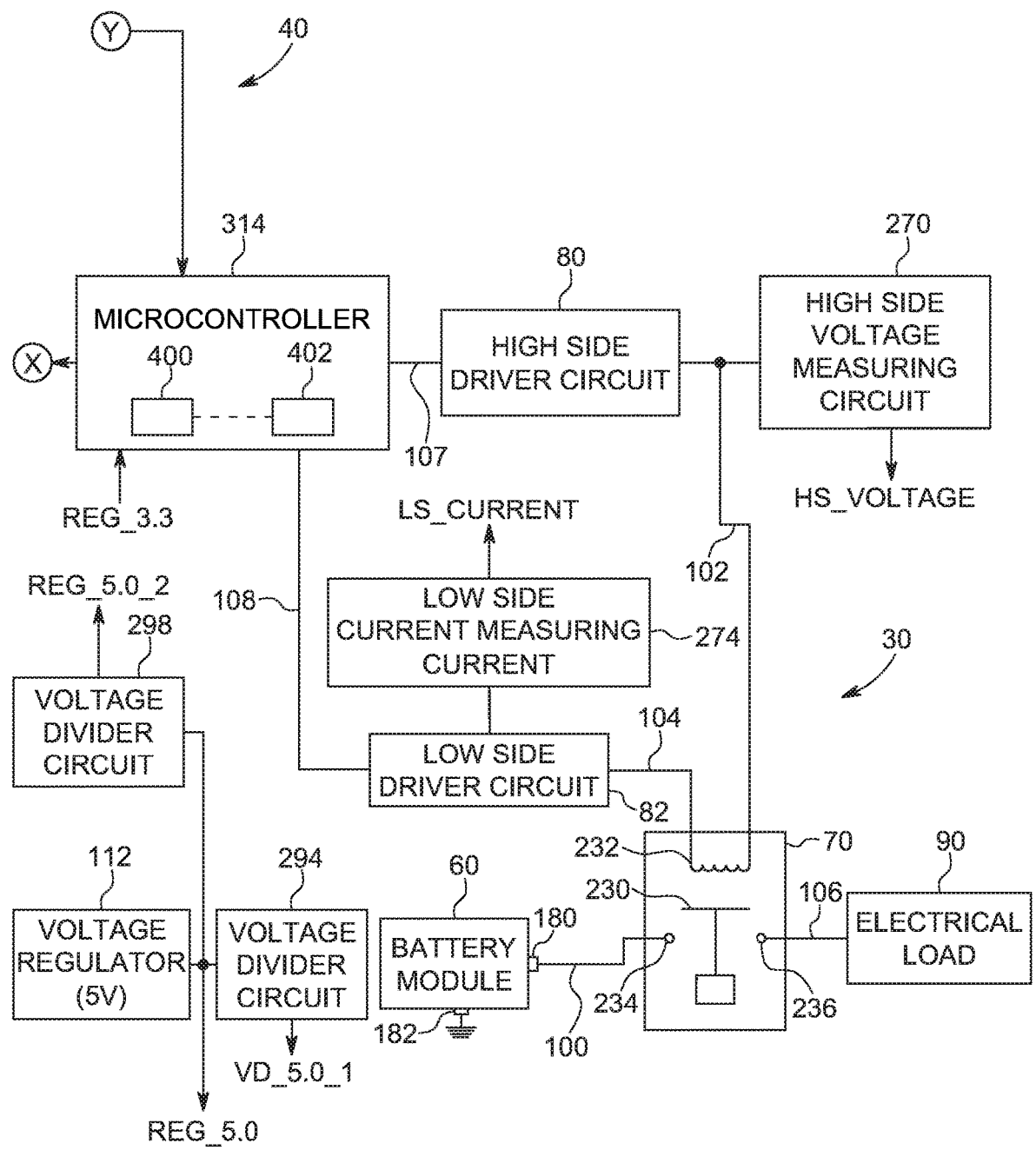
Figure 2:
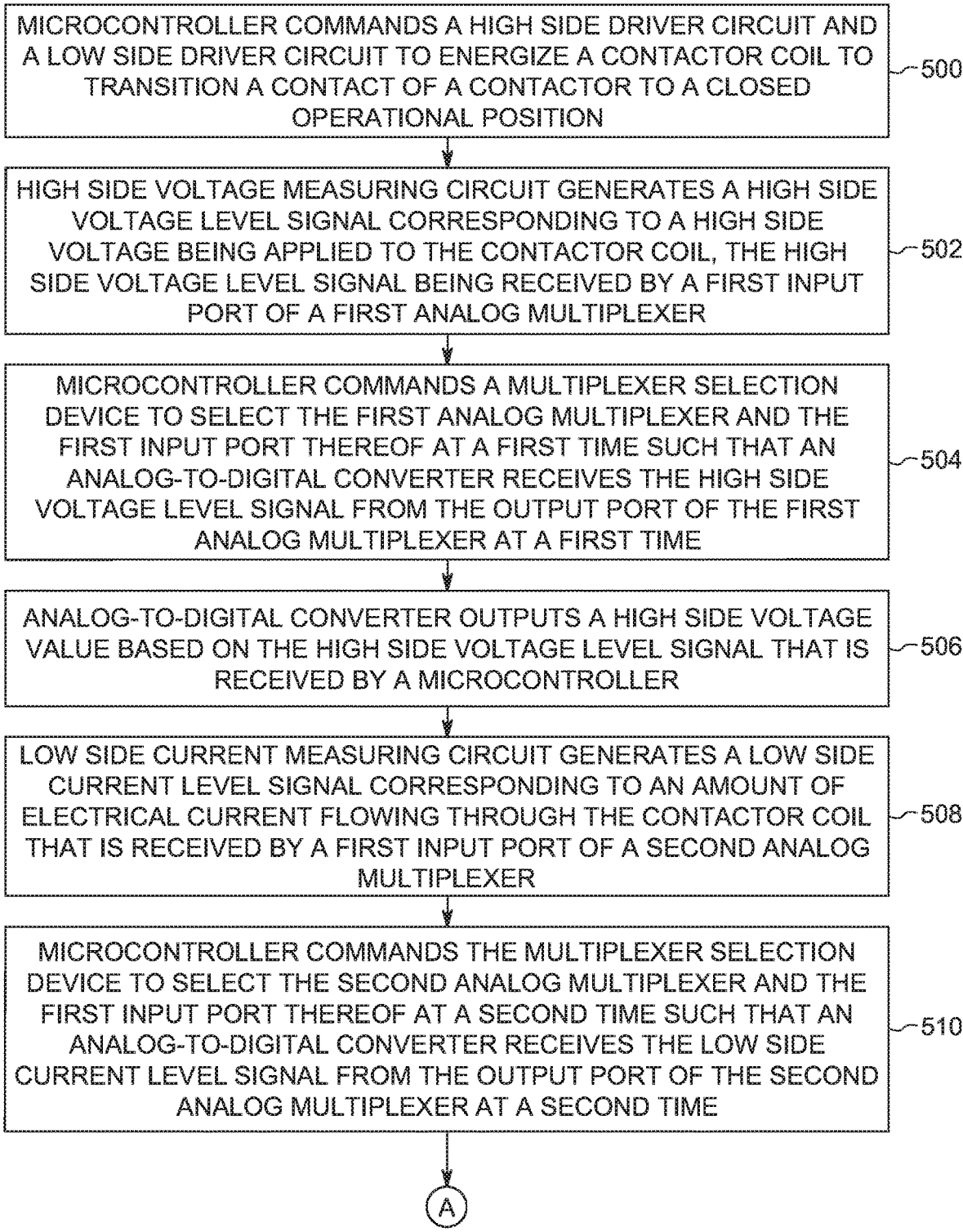
FIGS. 2-5 is a flowchart of a diagnostic method utilized by the diagnostic system of FIGS. 1A and 1B.
Figure 3:
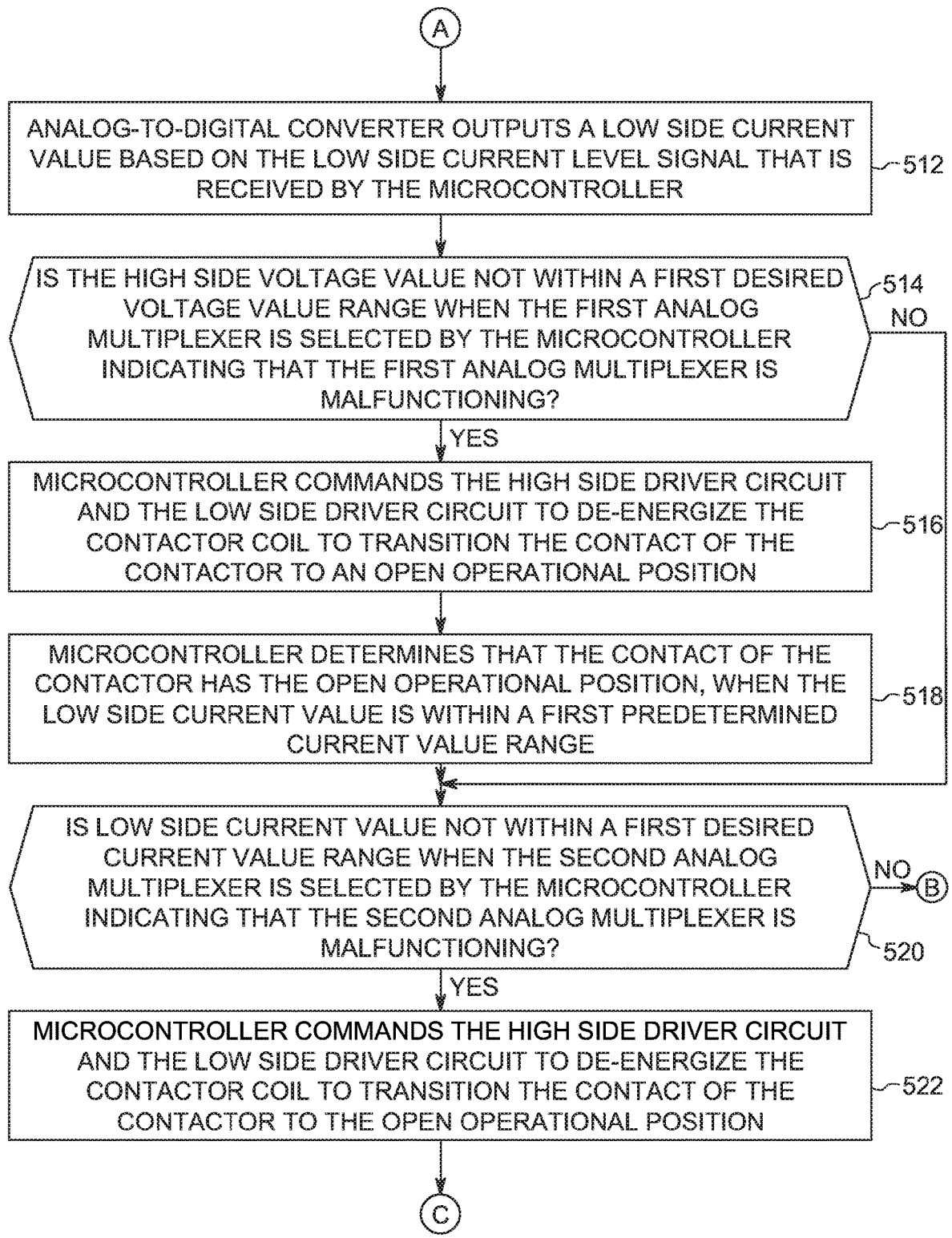
Figure 4:
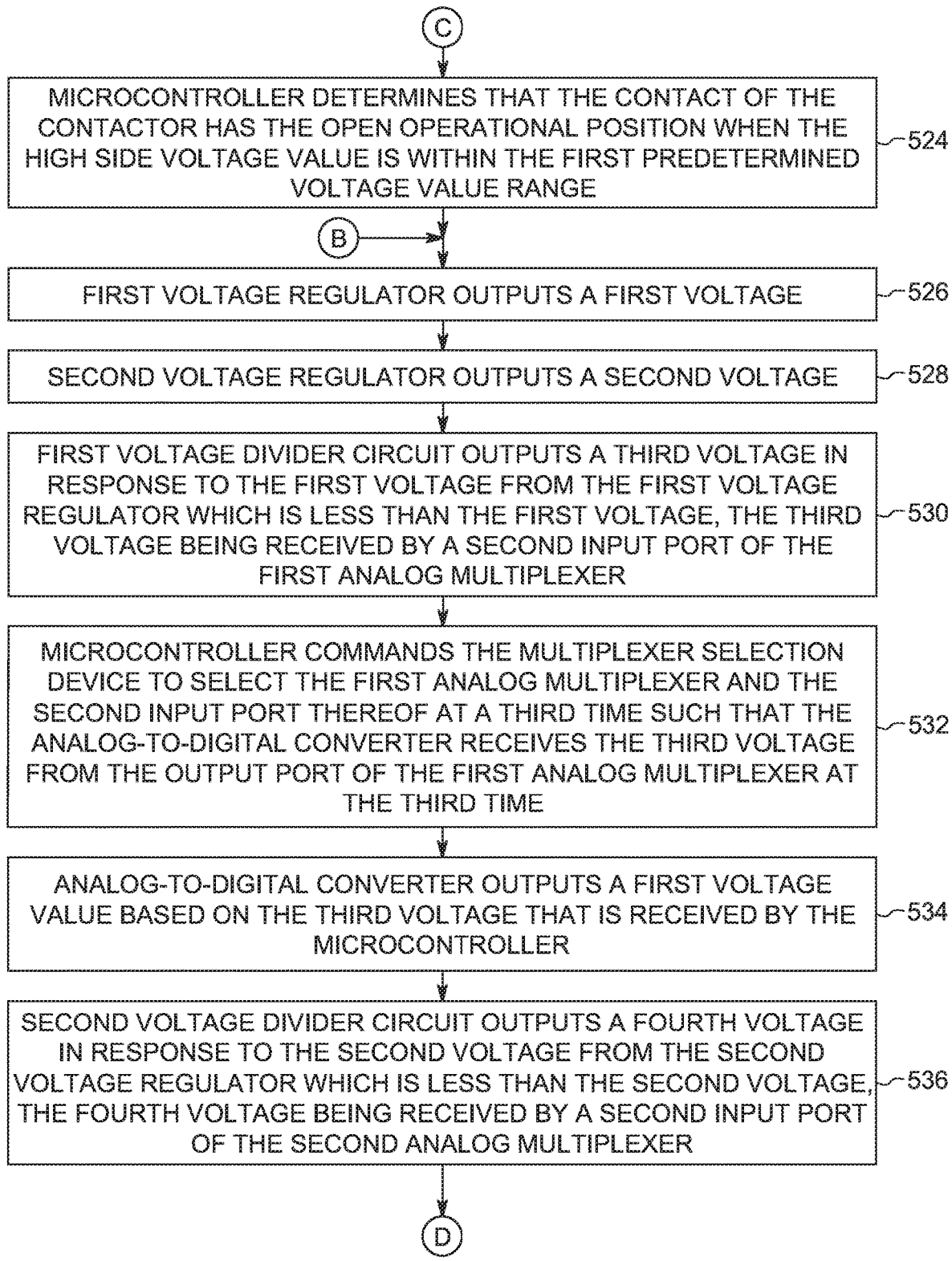
Figure 5:
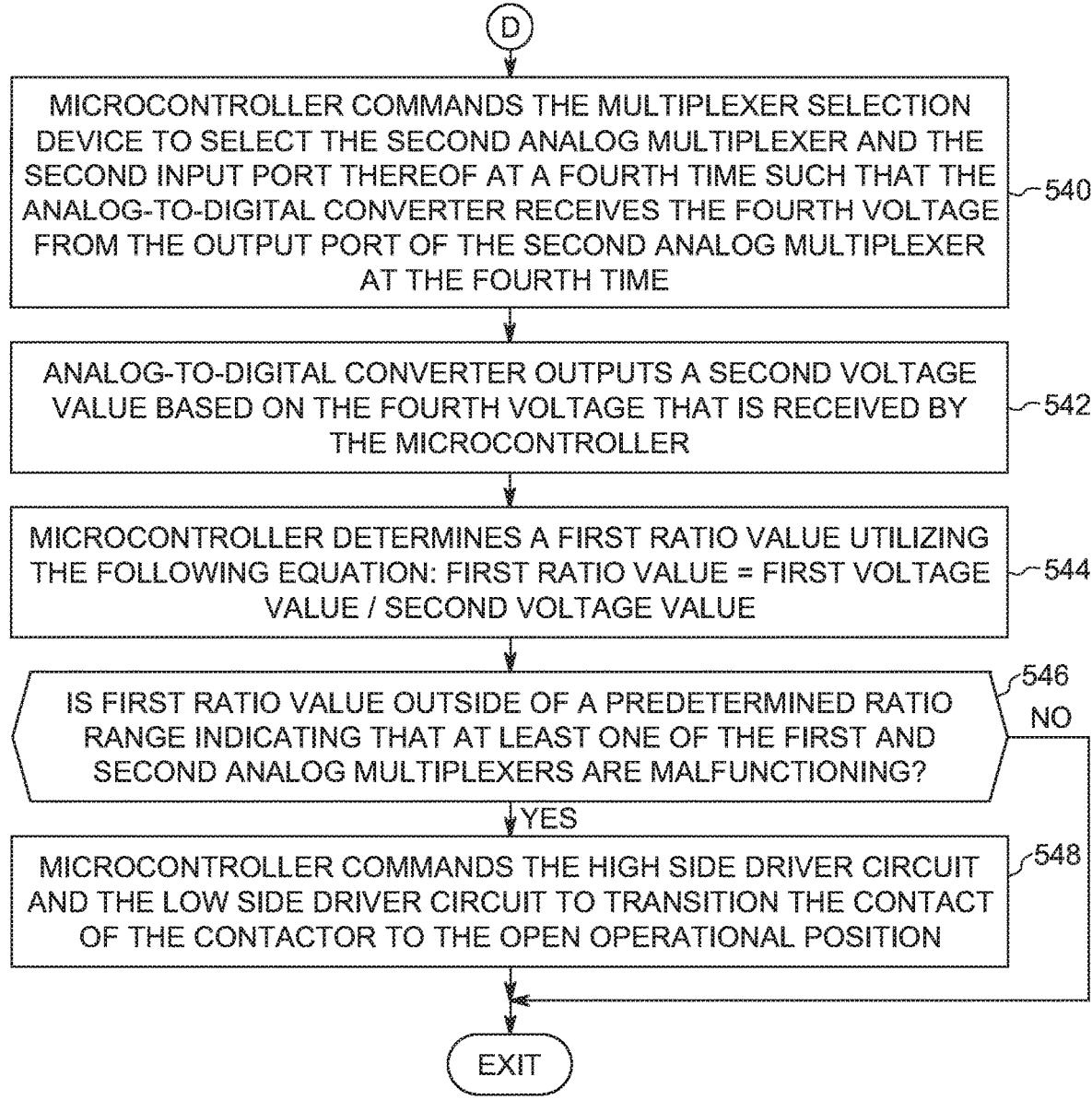

Referring to FIGS. 1A and 1B, a vehicle 10 is provided. The vehicle 10 includes a vehicle electrical system 30, and a diagnostic system 40 in accordance with an exemplary embodiment.

The vehicle electrical system 30 includes a battery module 60, a contactor 70, a high side driver circuit 80, a low side driver circuit 82, electrical lines 100, 102, 104, 106, 107, 108, a voltage regulator 110, and a voltage regulator 112.

An advantage of the diagnostic system 40 is that the system 40 transitions the contactor 70 to an open operational position if at least one of the first and second analog multiplexers 301, 302 are malfunctioning.

For purposes of understanding, a node is a region or a location in an electrical circuit.

The term "substantially" means ±5% of a value herein.

The battery module 60 includes a positive terminal 180 and a negative terminal 182. In an exemplary embodiment, the battery module 60 generates substantially 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery module 60 utilizing the electrical line 100. The second node 236 is electrically coupled to the electrical load 90 utilizing the electrical line 106. When the microcontroller 314 generates first and second control signals that are received by the high side driver circuit 80 and the low side driver circuit 82, respectively, the contactor coil 232 is energized which transitions the contact 230 to a closed operational state. Alternately, when the microcontroller 314 generates third and fourth control signals that are received by the high side driver circuit 80 and the low side driver circuit 82, respectively, the contactor coil 232 is de-energized which transitions the contact 230 to an open operational state. In an exemplary embodiment, the third and fourth control signals can each be a ground voltage level.

The high side driver circuit 80 and the low side driver circuit 82 are provided to energize or de-energize the contactor coil 232. The high side driver circuit 80 is electrically coupled to the microcontroller 314 utilizing the electrical line 107. The high side driver circuit 80 is further electrically coupled to a first end of the contactor coil 232 utilizing the electrical line 102. The high side driver circuit 80 energizes the contactor coil 232, when the high side driver circuit 80 receives a control signal from the microcontroller 314.

The low side driver circuit 82 is electrically coupled to the microcontroller 314 utilizing the electrical line 108. The low side driver circuit 82 is further electrically coupled to a second end of the contactor coil 232 utilizing the electrical line 104. The low side driver circuit 82 is configured to conduct an electrical current therethrough to the electrical ground for energizing the contactor coil 232, when the low side driver circuit 82 receives a control signal from the microcontroller 314.

The electrical load 90 is electrically coupled to the second node 236 of the contactor 70. When the contactor 70 has a closed operational position, a positive voltage from the battery module 60 is applied to the electrical load 90 for energizing the electrical load 90. When the contactor 70 has an open operational position, the positive voltage from the battery module 60 is removed from the electrical load 90 which de-energizes the electrical load 90.

The voltage regulator 110 has an output terminal that outputs a first voltage (e.g., substantially 3.3 Vdc) therefrom. The output terminal of the voltage regulator 110 is electrically coupled to the input port IN1_2 of the second analog multiplexer 302, and to the voltage divider circuit 286, and to the voltage clamping circuit 282, which each receive the first voltage from the output terminal of the voltage regulator 110. The output terminal of the voltage regulator 110 is further electrically coupled to the microcontroller 314.

The voltage regulator 112 has an output terminal that outputs a second voltage (e.g., substantially 5.0 Vdc) therefrom. The output terminal of the voltage regulator 112 is electrically coupled to the input port IN3_1 of the first analog multiplexer 301, and to the voltage divider circuit 294, and to the voltage diver circuit 298, which each receive the second voltage from the output terminal of the voltage regulator 112.

The diagnostic system 40 includes a high side voltage measuring circuit 270, a low side current measuring circuit 274, a voltage clamping circuit 282, a voltage divider circuit 286, a voltage divider circuit 294, a voltage divider circuit 298, a first analog multiplexer 301, a second analog multiplexer 302, a multiplexer selection device 306, an analog-to-digital converter 310, and a microcontroller 314.

The high side voltage measuring circuit 270 is electrically coupled to the high side driver circuit 80 and to the input port IN1_1 of the first analog multiplexer 301. The high side voltage measuring circuit 270 generates a high side voltage level signal (HS_VOLTAGE) corresponding to a high side voltage being applied to the contactor coil 232 of the contactor 70. The high side voltage level signal (HS_VOLTAGE) is received by the input port IN1_1 of the first analog multiplexer 301.

The low side current measuring circuit 274 is electrically coupled to the low side driver circuit 82, and is further electrically coupled to an input port IN2_2 of the second analog multiplexer 302. The low side current measuring circuit 274 generates a low side current level signal (LS_CURRENT) corresponding to an amount of electrical current flowing through the contactor coil 232 that is received by the input port IN2_2 of the second analog multiplexer 302.

The voltage clamping circuit 282 is electrically coupled to the voltage regulator 110, and is further electrically coupled to the input port IN2_1 of the first analog multiplexer 301. The voltage clamping circuit 282 receives the voltage (REG_3.3) from the voltage regular 110, and outputs a voltage (CLAMP_3.3) in response thereto that is received at the input port IN2_1 of the first analog multiplexer 301.

The voltage divider circuit 286 is electrically coupled to the voltage regulator 110, and is further electrically coupled to the input port IN3_2 of the second analog multiplexer 302. The voltage divider circuit 286 receives the voltage (REG_3.3) from the voltage regular 110, and outputs a voltage (VD_3.3) in response thereto that is received at the input port IN3_2 of the second analog multiplexer 302. The voltage (VD_3.3) is less than the voltage (REG_3.3).

The voltage divider circuit 294 is electrically coupled to the voltage regulator 112, and is further electrically coupled to the input port IN4_1 of the first analog multiplexer 301. The voltage divider circuit 294 receives the voltage (REG_5.0) from the voltage regular 112, and outputs a voltage (VD_5.0_1) in response thereto that is received at the input port IN4_1 of the first analog multiplexer 301. The voltage (VD_5.0_1) is less than the voltage (REG_5.0).

The voltage divider circuit 298 is electrically coupled to the voltage regulator 112, and is further electrically coupled to the input port IN4_2 of the second analog multiplexer 302. The voltage divider circuit 294 receives the voltage (REG_5.0) from the voltage regular 112, and outputs a voltage (VD_5.0_2) in response thereto that is received at the input port IN4_2 of the second analog multiplexer 302. The voltage (VD_5.0_2) is less than the voltage (REG_5.0).

The first analog multiplexer 301 is provided to selectively route one signal from one of the input ports IN1_1, IN2_1, IN3_1, IN4_1 to the output port OUT_1. The first analog multiplexer 301 has the input ports IN1_1, IN2_1, IN3_1, IN4_1, the output port OUT_1, a select port SEL_1, and address ports A0_1, A1_1, A2_1. The input port IN1_1 is electrically coupled to the high side voltage measuring circuit 270. The input port IN2_1 is electrically coupled to the voltage clamping circuit 282. The input port IN3_1 is electrically coupled to the voltage regulator 112. The input port IN4_1 is electrically coupled to the voltage divider circuit 294. The output port OUT_1 is electrically coupled to the input port AD_IN of the analog-to-digital converter 310. The address ports A0_1, A1_1, A2_1 are electrically coupled to the address ports A0, A1, A2, respectively, of the multiplexer selection device 306. The select port SEL_1 is electrically coupled to the select port SEL_1 of the multiplexer selection device 306.

When the multiplexer selection device 306 outputs a high logic level that is received at the select port SEL_, the first analog multiplexer 301 is selected. Further, the multiplexer selection device 306 outputs the address signals A0, A1, A2 that is received at the address ports A0_1, A1_1, A2_1, respectively, to select one of the input ports IN1_1, IN2_1, IN3_1, IN4_1 in which to route an associated analog signal thereof to the output port OUT_1. For example, when the first analog multiplexer 301 and the input port IN1_1 is selected, the signal (HS_VOLTAGE) is routed from the input port IN1_1 to the output port OUT_1 and is further routed to the analog-to-digital converter 310. Further, the analog-to-digital converter 310 measures the signal (HS_VOLTAGE) and generates an associated voltage value that is received by the microcontroller 314.

The second analog multiplexer 302 is provided to selectively route one signal from one of the input ports IN1_2, IN2_2, IN3_2, IN4_2 to the output port OUT_2. The second analog multiplexer 302 has the input ports IN1_2, IN2_2, IN3_2, IN4_2, the output port OUT_2, a select port SEL_2, and address ports A0_2, A1_2, A2_2. The input port IN1_2 is electrically coupled to the voltage regulator 110. The input port IN2_2 is electrically coupled to the low side current measuring circuit 274. The input port IN3_2 is electrically coupled to the voltage divider circuit 286. The input port IN4_2 is electrically coupled to the voltage divider circuit 298. The output port OUT_2 is electrically coupled to the input port AD_IN of the analog-to-digital converter 310. The address ports A0_2, A1_2, A2_2 are electrically coupled to the address ports A0, A1, A2, respectively of the multiplexer selection device 306. The select port SEL_2 is electrically coupled to the select port SEL_1 of the multiplexer selection device 306.

When the multiplexer selection device 306 outputs a high logic level that is received at the select port SEL_2, the second analog multiplexer 302 is selected. Further, the multiplexer selection device 306 outputs the address signals A0, A1, A2 that is received at the address ports A0_2, A1_2, A2_2, respectively, to select one of the input ports IN1_2, IN2_2, IN3_2, IN4_2 in which to route an associated analog signal thereof to the output port OUT_2. For example, when the second analog multiplexer 302 and the input port IN1_2 is selected, the signal (REG_3.3) is routed from the input port IN1_2 to the output port OUT_2 and is further routed to the analog-to-digital converter 310. Further, the analogto-digital converter 310 measures the signal (REG_3.3) and generates an associated voltage value that is received by the microcontroller 314.

The multiplexer selection device 306 is provided to select one of the first and second analog multiplexers 301, 302 at a time for routing a signal to the analog-to-digital converter 310, in response to a control signal from the microcontroller 314. The multiplexer selection device 306 includes a control port CT, a select port SEL_1, a selection port SEL_2, and address ports A0, A1, A2. The control port CT is electrically coupled to the microcontroller 314. The selection port SEL_1 is electrically coupled to the select port SEL_1 of the first analog multiplexer 301. The selection port SEL_2 is electrically coupled to the select port SEL_2 of the second analog multiplexer 302. The address ports A0, A1, A2 are electrically coupled to the address ports A0_1, A1_1, A2_1, respectively, of the first analog multiplexer 301 and to address ports A0_2, A1_2, A2_2, respectively, of the second analog multiplexer 302.

When the multiplexer selection device 306 receives a control signal from at the control port CT indicating a specific analog multiplexer to select and a specific port within the analog multiplexer to select, the multiplexer selection device 306 generates a high logic level at one of the select ports SEL_1, SEL_2, and corresponding signals in the address ports A0, A1, A2.

The analog-to-digital converter 310 has an input port AD_IN and an output port AD_OUT. The input port AD_IN is electrically coupled to an output port OUT_1 of the first analog multiplexer 301 and an output port OUT_2 of the second analog multiplexer 302. The output port AD_OUT is electrically coupled to the microcontroller 314. The analog-to-digital converter 310 measures a signal at the AD_IN input port and generates a value corresponding to a magnitude of the signal at the AD_IN input port that is output at the output port AD_OUT and is received by the microcontroller 314. In an exemplary embodiment, the analog-to-digital converter 310 is a single channel analog-to-digital converter.

The microcontroller 314 is programmed to monitor voltages utilizing the microprocessor 400 which executes software instructions stored in the memory device 402. The microprocessor 400 is operably coupled to the memory device 402, the analog-to-digital converter 310, the multiplexer selection device 306, the high side driver circuit 80, the low side driver circuit 82, and the voltage regulator 110. The microcontroller 314 outputs control signals that are received by the driver circuits 80, 82 for controlling the operation of the contactor 70. The memory device 402 stores data, tables, and the software applications described herein for implementing the methods described therein.

Referring to FIGS. 1A, 1B, and 2-5, a flowchart of a diagnostic method for the vehicle electrical system 30 will now be explained.

At step 500, the microcontroller 314 commands a high side driver circuit 80 and a low side driver circuit 82 to energize a contactor coil 232 to transition a contact 230 of a contactor 70 to a closed operational position. After step 500, the method advances to step 502.

At step 502, the high side voltage measuring circuit generates a high side voltage level signal corresponding to a high side voltage being applied to the contactor coil 232. The high side voltage level signal is received by a first input port (e.g., input port IN1_1) of a first analog multiplexer 301. After step 502, the method advances to step 504.

At step 504, the microcontroller 314 commands a multiplexer selection device 306 to select the first analog multiplexer 301 and the first input port (e.g., input port IN1_1) thereof at a first time such that an analog-to-digital converter 310 receives the high side voltage level signal from the output port AD_OUT of the first analog multiplexer 301 at a first time. After step 504, the method advances to step 506.

At step 506, the analog-to-digital converter 310 outputs a high side voltage value based on the high side voltage level signal that is received by a microcontroller 314. After step 506, the method advances to step 508.

At step 508, the low side current measuring circuit 274 generates a low side current level signal corresponding to an amount of electrical current flowing through the contactor coil 232 that is received by a first input port (e.g., input port IN2_2) of a second analog multiplexer 302. After step 508, the method advances to step 510.

At step 510, the microcontroller 314 commands the multiplexer selection device 306 to select the second analog multiplexer 302 and the first input port (e.g., input port IN2_2) thereof at a second time such that an analog-to-digital converter 310 receives the low side current level signal from the output port OUT_2 of the second analog multiplexer 302 at a second time. After step 510, the method advances to step 512.

At step 512, the analog-to-digital converter 310 outputs a low side current value on the low side current level signal that is received by the microcontroller 314. After step 512, the method advances to step 514.

At step 514, the microcontroller 314 makes a determination as to whether the high side voltage value is not within a first desired voltage value range when the first analog multiplexer 301 is selected by the microcontroller 314 indicating that the first analog multiplexer 301 is malfunctioning. If the value of step 514 equals "yes", the method advances to step 516. Otherwise, the method advances to step 520.

At step 516, the microcontroller 314 commands the high side driver circuit 80 and the low side driver circuit 82 to de-energize the contactor coil 232 to transition the contact 230 of the contactor 70 to an open operational position. After step 516, the method advances to step 518.

At step 518, the microcontroller 314 determines that the contact 230 of the contactor 70 has the open operational position, when the low side current value is within a first predetermined current value range. After step 518, the method advances to step 520.

At step 520, the microcontroller 314 makes a determination as to whether the low side current value is not within a first desired current value range when the second analog multiplexer 302 is selected by the microcontroller 314 indicating that the second analog multiplexer 302 is malfunctioning. If the value of step 520 equals "yes", the method advances to step 522. Otherwise, the method advances to step 526.

At step 522, the microcontroller 314 commands the high side driver circuit 80 and the low side driver circuit 82 to de-energize the contactor coil 232 to transition the contact 230 of the contactor 70 to the open operational position. After step 522, the method advances to step 524.

At step 524, the microcontroller 314 determines that the contact 230 of the contactor 70 has the open operational position when the high side voltage value is within the first predetermined voltage value range. After step 524, the method advances to step 526.

At step 526, the voltage regulator 112 outputs a first voltage. After step 526, the method advances to step 528.

At step 528, the voltage regulator 110 outputs a second voltage. After step 528, the method advances to step 530.

At step 530, the voltage divider circuit 294 outputs a third voltage in response to the first voltage from the voltage regulator 112 which is less than the first voltage. The third voltage is received by a second input port (e.g., input port IN4_1) of the first analog multiplexer 301. After step 530, the method advances to step 532.

At step 532, the microcontroller 314 commands the multiplexer selection device 306 to select the first analog multiplexer 301 and the second input port (e.g., input port IN4_1) thereof at a third time such that the analog-to-digital converter 310 receives the third voltage from the output port OUT_1 of the first analog multiplexer 301 at the third time. After step 532, the method advances to step 534.

At step 534, the analog-to-digital converter 310 outputs a first voltage value based on the third voltage that is received by the microcontroller 314. After step 534, the method advances to step 536.

At step 536, the voltage divider circuit 286 outputs a fourth voltage in response to the second voltage from the voltage regulator 110 which is less than the second voltage. The fourth voltage is received by a second input port (e.g., input port IN3_2) of the second analog multiplexer 302. After step 536, the method advances to step 540.

At step 540, the microcontroller 314 commands the multiplexer selection device 306 to select the second analog multiplexer 302 and the second input port (e.g., input port IN3_2) thereof at a fourth time such that the analog-to-digital converter 310 receives the fourth voltage from the output port of the second analog multiplexer 302 at the fourth time. After step 540, the method advances to step 542.

At step 542, the analog-to-digital converter 310 outputs a second voltage value based on the fourth voltage that is received by the microcontroller 314. After step 542, the method advances to step 544.

At step 544, the microcontroller 314 determines a first ratio value utilizing the following equation: first ratio value=first voltage value/second voltage value. After step 544, the method advances to step 546.

At step 546, the microcontroller 314 makes a determination as to whether the first ratio value is outside of a predetermined ratio range indicating that at least one of the first and second analog multiplexer 301, 302 are malfunctioning. In particular, the predetermined ratio range has an upper threshold ratio and a lower threshold ratio, and when the first ratio value is less than the lower threshold ratio then the microcontroller 314 determines that the second analog multiplexer 302 is malfunctioning, and when the first ratio is greater than the upper threshold ratio then the microcontroller 314 determines that the first analog multiplexer 301 is malfunctioning. If the value of step 546 equals "yes", the method advances to step 548. Otherwise, the method is exited.

At step 548, the microcontroller 314 commands the high side driver circuit 80 and the low side driver circuit 82 to transition the contact 230 of the contactor 70 to the open operational position. After step 548, method is exited.

The diagnostic system described herein for a vehicle electrical system provides a substantial advantage over other systems. In particular, the diagnostic system described herein transitions a contactor to an open operational position if at least one of the first and second analog multiplexers are malfunctioning.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a vehicle electrical system, the vehicle electrical system having a battery module, a contactor, a high side driver circuit, and a low side driver circuit, comprising:
    a high side voltage measuring circuit being electrically coupled to the high side driver circuit and to a first input port of a first analog multiplexer; the high side voltage measuring circuit generating a high side voltage level signal corresponding to a high side voltage being applied to a contactor coil of the contactor, the high side voltage level signal being received by the first input port;
    a low side current measuring circuit being electrically coupled to the low side driver circuit, and further electrically coupled to a second input port of a second analog multiplexer; the low side current measuring circuit generating a low side current level signal corresponding to an amount of electrical current flowing through the contactor coil that is received by the second input port;
    an analog-to-digital converter being electrically coupled to an output port of the first analog multiplexer and an output port of the second analog multiplexer, the analog-to-digital converter receiving the high side voltage level signal and the low side current level signal at first and second times, respectively, and outputs a high side voltage value and a low side current value, respectively, based on the high side voltage level signal and the low side current level signal, respectively, that are received by a microcontroller; and
    the microcontroller commanding the high side driver circuit and the low side driver circuit to transition a contact of the contactor to an open operational position when the first analog multiplexer is malfunctioning based on the high side voltage value.

2. The diagnostic system of claim 1, wherein the microcontroller further determining that the contact of the contactor has the open operational position based on the low side current value.

3. The diagnostic system of claim 1, wherein the microcontroller determines that the first analog multiplexer is malfunctioning when the analog-to-digital converter is not outputting the high side voltage value that is within a first desired voltage value range when the first analog multiplexer is selected by the microcontroller.

4. The diagnostic system of claim 1, wherein the microcontroller determines that the contact of the contactor has the open operational position, when the low side current value is within a first predetermined current value range.

5. The diagnostic system of claim 1, further comprising:
    the microcontroller commanding the high side driver circuit and the low side driver circuit to transition the contact of the contactor to the open operational position when the microcontroller determines that the second analog multiplexer is malfunctioning based on the low side current value; and the microcontroller further determining that the contact of the contactor has the open operational position based on the high side voltage value.

6. The diagnostic system of claim 5, wherein the microcontroller determines that the second analog multiplexer is malfunctioning when the analog-to-digital converter is not outputting the low side current value that is within a first desired current value range when the second analog multiplexer is selected by the microcontroller.

7. The diagnostic system of claim 5, wherein the microcontroller determines that the contact of the contactor has the open operational position based on the high side voltage value, when the high side voltage value is within a first predetermined voltage value range.

8. The diagnostic system of claim 1, wherein the microcontroller commanding the high side driver circuit and the low side driver circuit to transition the contact of the contactor to the open operational position by stopping a generation of first and second command signals, respectively, that are received by the high side driver circuit and the low side driver circuit, respectively.

9. The diagnostic system of claim 1, wherein the analog-to-digital converter is a single-channel analog-to-digital converter.

10. The diagnostic system of claim 1, wherein the contact being electrically coupled between the battery module and an electrical load, the high side driver circuit being electrically coupled to a high side end of the contactor coil, the low side driver circuit being electrically coupled to a low side end of the contactor coil.

11. The diagnostic system of claim 1, wherein the vehicle electrical system further includes first and second voltage regulators, the first voltage regulator outputting a first voltage, the second voltage regulator outputting a second voltage, the diagnostic system further comprising:

a first voltage divider circuit outputting a third voltage in response to the first voltage which is less than the first voltage;

a second voltage divider circuit outputting a fourth voltage in response to the second voltage which is less than the second voltage, the fourth voltage being greater than the third voltage;

the first analog multiplexer having a third input port, the third input port of the first analog multiplexer receiving the third voltage from the first voltage divider circuit;

the second analog multiplexer having a fourth input port receiving the fourth voltage from the second voltage divider circuit;

the analog-to-digital converter receiving the third voltage from the output port of the first analog multiplexer and the fourth voltage from the output port of the second analog multiplexer at third and fourth times, respectively, and outputting a first voltage value and a second voltage value, respectively, based on the third voltage and the fourth voltage, respectively, that are received by the microcontroller;

the microcontroller determining a first ratio value based on the first and second voltage values; and the microcontroller commanding the high side driver circuit and the low side driver circuit to transition the contact of the contactor to the open operational position when the first ratio value is outside of a predetermined ratio range indicating that at least one of the first and second analog multiplexers are malfunctioning.

12. The diagnostic system of claim 11, wherein the microcontroller determines the first ratio value utilizing the following equation: first ratio value=first voltage value/second voltage value.

13. The diagnostic system of claim 12, wherein the predetermined ratio range has an upper threshold ratio and a lower threshold ratio, and when the first ratio value is less than the lower threshold ratio then the microcontroller determines that the second analog multiplexer is malfunctioning, and when the first ratio is greater than the upper threshold ratio then the microcontroller determines that the first analog multiplexer is malfunctioning.

* * * * *